US008563442B2

(12) United States Patent
Kawamura et al.

(10) Patent No.: US 8,563,442 B2
(45) Date of Patent: Oct. 22, 2013

(54) METHOD FOR MANUFACTURING NITROGEN COMPOUND SEMICONDUCTOR SUBSTRATE AND NITROGEN COMPOUND SEMICONDUCTOR SUBSTRATE, AND METHOD FOR MANUFACTURING SINGLE CRYSTAL SIC SUBSTRATE AND SINGLE CRYSTAL SIC SUBSTRATE

(75) Inventors: Keisuke Kawamura, Sakai (JP); Katsutoshi Izumi, Sakai (JP); Hidetoshi Asamura, Sakai (JP); Takashi Yokoyama, Matsumoto (JP)

(73) Assignee: Air Water Inc. (JP)

( * ) Notice: Subject to any disclaimer, the term of this patent is extended or adjusted under 35 U.S.C. 154(b) by 244 days.

(21) Appl. No.: 12/997,013

(22) PCT Filed: Jun. 9, 2009

(86) PCT No.: PCT/JP2009/060823
§ 371 (c)(1),
(2), (4) Date: Dec. 9, 2010

(87) PCT Pub. No.: WO2009/151133
PCT Pub. Date: Dec. 17, 2009

(65) Prior Publication Data
US 2011/0089433 A1  Apr. 21, 2011

(30) Foreign Application Priority Data
Jun. 10, 2008  (JP) ................................. 2008-151433
Jun. 10, 2008  (JP) ................................. 2008-151434

(51) Int. Cl.
*H01L 21/31* (2006.01)
*H01L 21/469* (2006.01)

(52) U.S. Cl.
USPC ...................... 438/769; 257/77; 257/E21.065

(58) Field of Classification Search
USPC .................... 438/769, 762; 257/77, E21.065, 257/E21.054–E21.055
See application file for complete search history.

(56) References Cited

U.S. PATENT DOCUMENTS 5,667,586 A * 9/1997 Ek et al. ........................... 117/84
5,759,908 A * 6/1998 Steckl et al. ................. 438/479

FOREIGN PATENT DOCUMENTS

JP          2005-268460 A       9/2005

OTHER PUBLICATIONS

H Moller et al., "Suppression of Si cavities at the SiC/Si interface during epitaxial growth of 3C—SiC on silicon-on-insulator", *Journal of the Electrochemical Society*, 2001, vol. 148, No. 1, p. G16-G24.
International Preliminary Report on Patentability for PCT/JP2009/060823.
F. Y. Huang et al., "Epitaxial SiC grown on silicon-on-insulator substrate with ultra-thin silicon-over-layer", Thin Solid Films, Jul. 22, 2005, vol. 484, Issue 1-2, pp. 261-264.

* cited by examiner

*Primary Examiner* — Julio J Maldonado
*Assistant Examiner* — Sonya D McCall Shepard
(74) *Attorney, Agent, or Firm* — Wood, Phillips, Katz, Clark & Mortimer

(57) ABSTRACT

In order to provide a method for manufacturing a single crystal SiC substrate that can obtain an SiC layer with good crystallinity, an Si substrate 1 having a surface Si layer 3 of a predetermined thickness and an embedded insulating layer 4 is prepared, and when the Si substrate 1 is heated in a carbon-series gas atmosphere to convert the surface Si layer 3 into a single crystal SiC layer 6, the Si layer in the vicinity of an interface 8 with the embedded insulating layer 4 is left as a residual Si layer 5.

5 Claims, 12 Drawing Sheets

METHOD FOR MANUFACTURING NITROGEN COMPOUND SEMICONDUCTOR SUBSTRATE AND NITROGEN COMPOUND SEMICONDUCTOR SUBSTRATE, AND METHOD FOR MANUFACTURING SINGLE CRYSTAL SIC SUBSTRATE AND SINGLE CRYSTAL SIC SUBSTRATE

TECHNICAL FIELD

The present invention relates to a method for manufacturing a nitrogen compound semiconductor substrate as a semiconductor substrate of an insulating-layer-embedded type and the nitrogen compound semiconductor substrate manufactured by the method, and a method for manufacturing a single crystal SiC substrate as a semiconductor substrate of the insulating-layer-embedded type and the single crystal SiC substrate manufactured by the method.

RELATED ART

A nitrogen compound, such as gallium nitride and aluminum nitride, is a wide gap semiconductor of direct band-gap type, and because it excels, comparing with a silicon semiconductor, in insulation breakdown electric field, saturation electron velocity, and chemical stability, the nitrogen compound has attracted an attention as a material for light-emitting device and semiconductor device for the next generation. An SOI substrate having an embedded insulating layer excels in speed-up and low power consumption of a circuit therein, and receives a high expectation as an LSI substrate for the next generation. Therefore, an insulating-layer-embedded type nitrogen compound semiconductor substrate which united these two features is very promising as a semiconductor device material.

As a method for manufacturing the nitrogen compound semiconductor substrate having the embedded insulating layer, a method where a silicon carbide layer is epitaxially grown on the SOI substrate and a nitride semiconductor layer is further epitaxially grown on the silicon carbide layer is proposed (for example, see Patent Document 1 below).

The main reason for using silicon carbide crystals as a base substrate of the nitrogen compound semiconductor as disclosed in Patent Document 1 is, because a mismatch between lattice constants of silicon carbide and the nitrogen compound semiconductor is comparatively small, and an occurrence of a misfit dislocation of a hetero interface in the nitrogen compound semiconductor can be suppressed comparing with a case where the nitrogen compound semiconductor is epitaxially grown directly on a surface silicon layer of the SOI substrate.

As an example, mismatches of lattice constants between a gallium nitride crystal, and sapphire and silicon, which have conventionally been used as the base substrate of the gallium nitride crystal, are approximately 16% and 20%, respectively, and on the other hand, a mismatch of lattice constants between gallium nitride and silicon carbide is approximately 3.5% and is considerably smaller than that of sapphire and silicon.

However, in the above method where the silicon carbide layer is epitaxially grown on the SOI substrate and the nitride semiconductor layer is further epitaxially grown on the silicon carbide layer, there has been a problem in which crystal defects easily occur in an interface of the silicon carbide and the silicon.

For this reason, in order to solve the above problem, a method where the surface silicon film of the SOI substrate is carbonized to be denatured into a silicon carbide layer to manufacture a silicon carbide substrate having an embedded oxide film, and a gallium nitride layer is epitaxially grown on the silicon carbide substrate is proposed (for example, Patent Documents 1 and 2 described below).

Meanwhile, as a method that can manufacture, by carbonizing the surface silicon film of the SOI substrate to denature it into the silicon carbide to layer, the SiC substrate having the embedded insulating layer, while easily realizing an increased diameter thereof with good cost performance, a method disclosed in Patent Document 3 below is proposed. This method uses an SOI substrate (insulating-layer-embedded type Si substrate) having a surface silicon layer of a predetermined thickness and an embedded insulating layer ($SiO_2$ layer) to produce the SiC substrate. That is, thinning the surface Si layer of the SOI substrate to approximately 10 nm, and by heating it for a predetermined period of time in a heating furnace under a mixture gas atmosphere of hydrogen gas and hydrocarbon-series gas, the surface silicon layer is carbonized at a high temperature to convert into a single crystal SiC thin film, and, by an epitaxial method using the single crystal SiC thin film as a seed layer, an SiC layer can be grown thereon.

Meanwhile, single crystal SiC (silicon carbide) excels in thermal and chemical stability, high in mechanical strength and resistant to irradiation of radioactive ray, and due to these properties, it has attracted an attention as a semiconductor device material for the next generation. The SOI substrate having the embedded insulating layer excels in speed-up and low power consumption of the circuit therein, and receives the high expectation as the LSI substrate for the next generation. Therefore, an insulating-layer-embedded type semiconductor SiC substrate which united these two features is very promising as a semiconductor device material.

As a method that can manufacture the insulating-layer-embedded type semiconductor SiC substrate, while easily realizing an increased diameter thereof with good cost performance, a method disclosed in Patent Document 3 below is proposed, for example. This method uses an SOI substrate (insulating-layer-embedded type Si substrate) having a surface silicon layer of a predetermined thickness and an embedded insulating layer ($SiO_2$ layer) to produce the SiC substrate. That is, by thinning the surface Si layer of the SOI substrate to approximately 10 nm and heating it for a predetermined period of time in a heating furnace under a mixture gas atmosphere of hydrogen gas and hydrocarbon-series gas, the surface silicon layer is carbonized at a high temperature to convert it into a single crystal SiC thin film, and, by an epitaxial method using the single crystal SiC thin film as a seed layer, an SiC layer can be grown thereon.

In the method of Patent Document 3 described above, by the carbonization treatment, the entire surface silicon layer having a thickness of approximately 10 nm or less is carbonized to generate the single crystal SiC thin film (SiC seed layer). However, by doing this, an irregular and large "waviness" occurs in an interface of the embedded oxide film and the SiC thin film. That is, because the interface of the converted SiC layer and the embedded $SiO_2$ layer is unstable under the high temperature and, especially, the Si→SiC reaction rapidly progresses in addition to SiC tends to enter the $SiO_2$ layer, the $SiC/SiO_2$ interface becomes unstable to be in a state where the interface is rough and waves.

Such "waviness" of the interface sometimes exceeds 10 nm, results in variation in the thickness of the SiC layer, and further causes a "waviness" even to the generated SiC thin film itself. Therefore, it is estimated to become a serious problem in use as a semiconductor. In addition, there also is a problem in which, in a state where the "waviness" exists in the interface and the SiC thin film itself, if epitaxially growing the SiC layer on the SiC thin film, crystallinity of the grown SiC layer itself is degraded, and the surface condition tends to become rough.

For this reason, a method for manufacturing a single crystal SiC substrate where the SOI substrate is heated in a carbon-series gas atmosphere to denature the surface silicon layer into an SiC seed layer is proposed (Patent Document 4 below). In this method, prior to the above denaturation, by ion-implanting nitrogen into the surface silicon layer to form a nitrogen-contained silicon layer in an interface vicinity area of the surface silicon layer with the embedded insulating layer, SiC generated by the denaturation is prevented from entering the embedded insulating layer.

Thereby, a single crystal SiC thin film having a uniform film thickness can be formed.

Patent Document 1: JP 10-287497A
Patent Document 2: JP08-236445A
Patent Document 3: JP2003-224248A
Patent Document 4: JP2005-268460A

SUMMARY OF THE INVENTION

Problems to be Solved by the Invention

However, in the above method of Patent Document 3, by the carbonizing treatment described above, the entire surface silicon layer having a thickness of approximately 10 nm or less is carbonized to generate the single crystal SiC thin film (SiC seed layer). By doing this, the irregular and large "waviness" occurs in the interface of the embedded oxide film and the SiC thin film. That is, because the interface of the converted SiC layer and the embedded $SiO_2$ layer is unstable at the high temperature and, especially, the Si→SiC reaction rapidly progresses in addition to SiC tends to enter the $SiO_2$ layer, the $SiC/SiO_2$ interface becomes unstable to be in the state where the interface is rough and waves.

Such "waviness" of the interface sometimes exceeds 10 nm, results in variation in the thickness of the SiC layer, and further causes the "waviness" even to the manufactured SiC thin film itself. Therefore, it is estimated to become a serious problem in use as a semiconductor. In addition, there also is a problem in which, in the state where the "waviness" exists in the interface and the SiC thin film itself, if epitaxially growing the SiC layer on the SiC thin film, crystallinity of the grown SiC layer itself can dramatically be degraded, and the surface condition tends to become rough. In addition, accompanying with the SiC layer in which the waviness occurs and the crystallinity is degraded, there also is a problem in which crystallinity of the nitride semiconductor epitaxially grown on the SiC layer is degraded.

For this reason, the method for manufacturing the single crystal SiC substrate where the SOI substrate is heated in the carbon-series gas atmosphere to denature the surface silicon layer into an SiC seed layer is proposed (Patent Document 4 described above). In this method, prior to the above denaturation, by ion-implanting nitrogen into the surface silicon layer to form the nitrogen-contained silicon layer in the interface vicinity area of the surface silicon layer with the embedded insulating layer, SiC generated by the denaturation is prevented from entering the embedded insulating layer. Thereby, the single crystal SiC thin film having the uniform film thickness can be formed.

However, in the above method of Patent Document 4 described above, although the "waviness" in the interface can be prevented, a nitrogen content in the nitrogen-contained silicon layer has to be significantly large as much as 1 to 30 atom %, and, generally, a dose amount no less than 100 to 1000 times of the amount for the ion implantation generally used for a semiconductor device manufacture is needed. Therefore, because a very expensive apparatus is needed for the ion implantation in large current and the ion implantation itself requires a long time, there are problems in which a manufacturing quantity per unit time is low and the cost is high.

In addition, in the above method of Patent Document 2 described above, although the "waviness" in the interface can be prevented, a nitrogen content in the nitrogen-contained silicon layer has to be significantly large as much as 1 to 30 atom %, and a dose amount no less than 100 to 1000 times of the amount for the ion implantation generally used for a semiconductor device manufacture is needed. Therefore, because a very expensive apparatus is needed for the ion implantation in large current and the ion implantation itself requires a long time, there are problems in which a manufacturing quantity per unit time is low and the cost is high.

The present invention is made in view of the above situations, and has an object to provide a method for manufacturing a nitrogen compound semiconductor substrate in which a nitrogen compound semiconductor layer with good crystallinity can be obtained with low cost and high productivity as well, and the nitrogen compound semiconductor substrate obtained by the method.

Further, the present invention is made in view of the above situations, and has an object to provide a method for manufacturing a single crystal SiC substrate in which an SiC layer with good crystallinity can be obtained with low cost and high productivity as well by making the interface of the SiC layer and an embedded insulating layer of $SiO_2$ or the like uniform, and the single crystal SiC substrate obtained by the method.

Means for Solving the Problem

In order to achieve the above object, a method for manufacturing a nitrogen compound semiconductor substrate according to an aspect of the invention includes preparing an Si substrate having a surface Si layer of a predetermined thickness and an embedded insulating layer, leaving the Si layer in the vicinity of an interface of the surface Si layer and the embedded insulating layer as a residual Si layer when the Si substrate is heated in a carbon-series gas atmosphere to convert the surface Si layer into a single crystal SiC layer, and further epitaxially growing a nitrogen compound semiconductor on the surface single crystal SiC.

Further, in order to achieve the above object, a nitrogen compound semiconductor substrate according to another aspect of the invention is manufactured by a method including forming a single crystal SiC layer on a surface side of a single crystal Si substrate having an embedded insulating layer with respect to the embedded insulating layer, forming an Si layer in the vicinity of an interface of the single crystal SiC layer and the embedded insulating layer, and forming a nitrogen compound semiconductor layer on the single crystal SiC layer.

In order to achieve the above object, a method for manufacturing a single crystal SiC substrate according to another aspect of the invention includes preparing an Si substrate having a surface Si layer of a predetermined thickness and an embedded insulating layer, and heating the Si substrate in a carbon-series gas atmosphere to convert the surface Si layer into a single crystal SiC layer. When converting the surface Si layer into the single crystal SiC layer, the Si layer in the vicinity of an interface with the embedded insulating layer is left as a residual Si layer.

Further, in order to achieve the above object, a single crystal SiC substrate according to another aspect of the invention is formed with a single crystal SiC layer that is formed on a surface side of a single crystal Si substrate having an embedded insulating layer with respect to the embedded insulating layer. An Si layer is formed in the vicinity of an interface of the single crystal SiC layer and the embedded insulating layer.

Effect of the Invention

That is, in the method for manufacturing the nitrogen compound semiconductor substrate according to the aspect of the invention, when converting the surface Si layer into the single crystal SiC layer, by leaving the surface Si layer in the vicinity of the interface with the embedded insulating layer as the residual Si layer, the flatness of the interface of the residual Si layer and the embedded insulating layer below the residual Si layer can dramatically be improved, and the "waviness" in the interface can dramatically be decreased. Thus, because the flatness of the interface of the embedded insulating layer and the residual Si layer improves, the "waviness" which occurs in the single crystal SiC layer itself formed on the surface can dramatically be suppressed. Thus, because the single crystal SiC layer with less waviness is formed, the nitrogen compound semiconductor formed on the single crystal SiC layer by the epitaxial growth can also be dramatically improved in crystallinity, and a performance as a semiconductor device can dramatically be improved. Moreover, because it does not depend on an ion implantation or the like, the nitrogen compound semiconductor substrate as the high quality semiconductor device described above can be manufactured with low cost and high productivity.

In the aspect of the invention, if epitaxially growing the single crystal SiC further on the denatured single crystal SiC layer and epitaxially growing the nitrogen compound semiconductor on the epitaxially-grown single crystal SiC, because the crystallinity of the growing SiC improves when further forming SiC as an upper layer of the single crystal SiC layer by the epitaxial growth, the crystallinity of the nitrogen compound semiconductor epitaxially grown on SiC becomes high, and, thereby, a good nitrogen compound semiconductor device can be obtained.

In the aspect of the invention, if the thickness of the residual Si layer is 3 to 20 nm, an effect for improving the flatness of the interface of the embedded insulating layer and the residual Si layer, and the single crystal SiC layer itself can sufficiently be obtained, and defects such as voids are hardly caused in the lower layers of the single crystal SiC layer. Therefore, a good nitrogen compound semiconductor device can be obtained.

In the nitrogen compound semiconductor substrate of the aspect of the invention, when converting the surface Si layer into the single crystal SiC layer, by leaving the Si layer in the vicinity of the interface with the embedded insulating layer as the residual. Si layer, the flatness of the interface of the residual Si layer and the embedded insulating layer below the residual Si layer can dramatically be improved, and the "waviness" in the interface can dramatically be decreased. Thus, because the flatness of the interface of the embedded insulating layer and the residual Si layer improves, the "waviness" which occurs in the single crystal SiC layer itself formed on the surface can dramatically be suppressed. Thus, because the single crystal SiC layer with less waviness is formed, the nitrogen compound semiconductor formed on the single crystal SiC layer by the epitaxial growth can also be dramatically improved in crystallinity, and a performance as a semiconductor device can dramatically be improved. Moreover, it does not depend on the ion implantation or the like, the nitrogen compound semiconductor substrate as the high quality semiconductor device described above can be manufactured with low cost and high productivity.

That is, the method for manufacturing the single crystal SiC substrate according to the aspect of the invention, when converting the surface Si layer into the single crystal SiC layer, by leaving the Si layer in the vicinity of the interface of the Si layer and the embedded insulating layer as the residual Si layer, the flatness of the interface of the residual Si layer and the embedded insulating layer below the residual Si layer can dramatically be improved, and the "waviness" in the interface can dramatically be decreased. Because the flatness of the interface of the embedded insulating layer and the residual Si layer improves, the "waviness" which occurs in the single crystal SiC layer itself formed on the surface can dramatically be suppressed. Thus, since the single crystal SiC layer with less waviness is formed, a performance as a semiconductor device can dramatically be improved. Moreover, it does not depend on the ion implantation or the like, the high quality semiconductor device described above can be manufactured with low cost and high productivity.

In the aspect of the invention, when further growing the single crystal SiC as an upper layer of the single crystal SiC layer on the surface by performing the epitaxial growth on the single crystal SiC substrate in which the residual Si layer is left in the vicinity of the interface of the single crystal SiC layer and the embedded insulating layer, because the crystallinity of the growing SiC improves even when further forming SiC as the upper layer of the single crystal SiC layer by the epitaxial growth as described above, therefore, SiC of beautiful single crystal and uniform thickness can be obtained.

In the aspect of the invention, if the thickness of the residual Si layer is 3 to 20 nm, an effect for improving the flatness of the interface of the embedded insulating layer and the residual Si layer, and the single crystal SiC layer itself can sufficiently be obtained, defects such as voids are hardly caused in the lower layers of the single crystal SiC layer, and, therefore, a good semiconductor device can be obtained.

Further, in the single crystal SiC substrate according to the aspect of the invention, because the Si layer is formed in the vicinity of the interface of the single crystal SiC layer and the embedded insulating layer, the flatness of the interface of the Si layer and the embedded insulating layer below the Si layer can dramatically be improved, and the "waviness" in the interface can dramatically be decreased. Because the flatness of the interface of the embedded insulating layer and the residual Si layer improves, the "waviness" which occurs in the single crystal SiC layer itself formed on the surface can dramatically be suppressed. Thus, because the single crystal SiC layer with less waviness is formed, a performance as a semiconductor device can dramatically be improved.

BRIEF DESCRIPTION OF THE DRAWINGS

FIG. 11 is cross-sectional TEM images of a single crystal SiC layer (seed layer) be the method of Example 1 in which SOI-A is used as the starting material.

Figure 1:
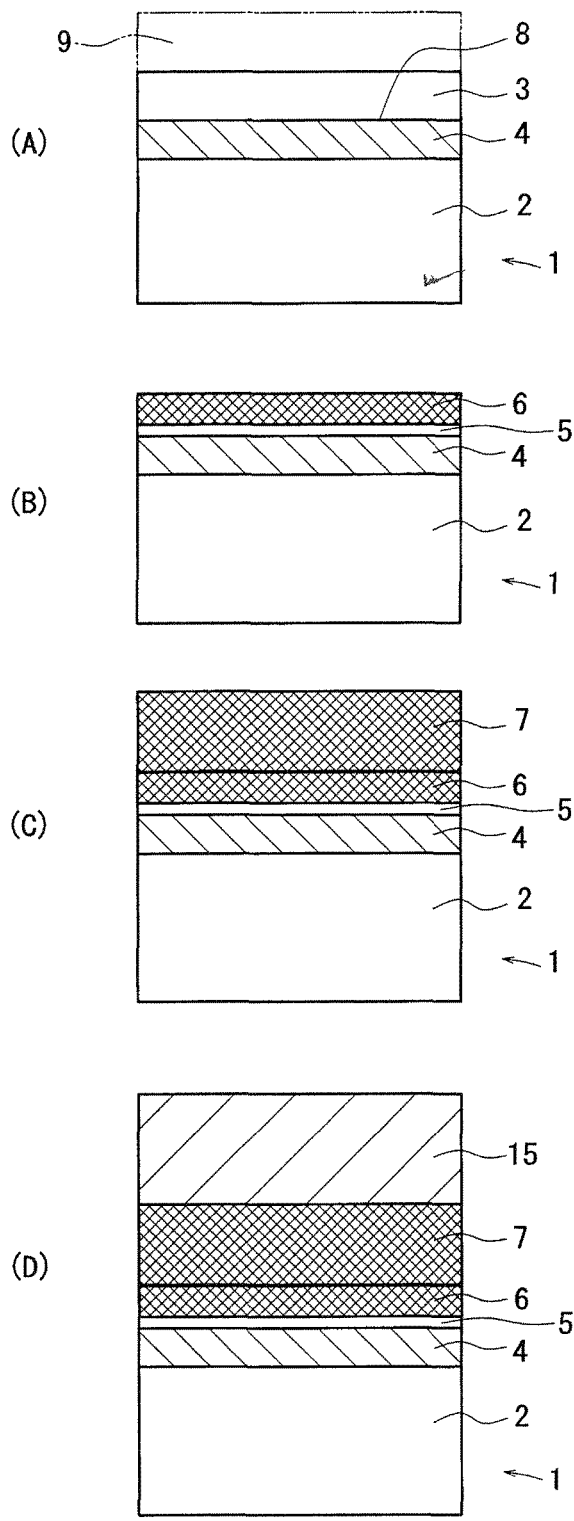
FIGS. 1(A) to 1(D) are views showing a method for manufacturing a nitrogen compound semiconductor substrate according to one embodiment of the present invention.

DESCRIPTION OF
REFERENCE NUMERALS

| | |
|---|---|
| 1 | Si Substrate |
| 2 | Si Base Material |
| 3 | Surface Si Layer |
| 4 | Embedded Insulating Layer |
| 5 | Residual Si Layer |
| 6 | Single Crystal SiC Layer |
| 7 | Single Crystal SiC Epitaxial Layer |
| 8 | Interface |
| 9 | Oxide Layer |
| 10 | Heating Furnace |
| 11 | Heater |
| 12 | Mixer |
| 13 | Canister |
| 14 | Canister |
| 15 | Nitrogen Compound Semiconductor Layer |

BEST MODE FOR CARRYING OUT THE INVENTION

Next, descriptions will be given of the best mode for carrying out the present invention.

FIGS. 1(A) to 1(D) are views showing one embodiment of a method for manufacturing a nitrogen compound semiconductor substrate according to the invention.

In the method for manufacturing the nitrogen compound semiconductor substrate, firstly, an Si substrate 1 including a surface Si layer 3 of a predetermined thickness and an embedded insulating layer 4 is prepared, and the thickness of the surface Si layer 3 of the Si substrate 1 thinned to be approximately 6 nm to 40 nm (FIG. 1(A)). Next, the Si substrate 1 is heated in a carbon-series gas atmosphere to convert the surface Si layer 3 into a single crystal SiC layer 6 (FIG. 1(B)). At this time, the Si layer in the vicinity of an interface 8 of the single crystal SiC layer 6 and the embedded insulating layer 4 is left as a residual Si layer 5. Subsequently, by epitaxial growth, a single crystal SiC epitaxial layer 7 is grown on the single crystal SiC layer 6 as a seed layer (FIG. 1(C)). Further, on the single crystal epitaxial SiC layer 7 formed by the epitaxial growth, a nitrogen compound semiconductor layer 15 is grown by epitaxial growth.

Hereinafter, each step is described in detail.

The Si substrate 1 is formed with an $SiO_2$ layer of a predetermined thickness as the embedded insulating layer 4 in the vicinity of a surface of an Si base material 2, and formed with the surface Si layer 3 of the predetermined thickness on the surface of the $SiO_2$ layer. The thickness of the embedded insulating layer 4 is set to be approximately 1 to 200 nm.

Subsequently, a thinning process is carried out for thinning the thickness of the surface Si layer 3 of the Si substrate 1. The thinning process is performed in a manner in which, for example, by heat-treating the Si substrate 1 in an oxidation atmosphere, the surface Si layer 3 is oxidized from the surface thereof by a predetermined depth to form an oxide layer 9 so that the Si layer of a desired thickness is left in the vicinity of the interface 8 with the embedded insulating layer 4. Then, the oxide layer 9 on the surface is etched by a hydrofluoric acid or the like to be removed, and the Si layer of the desired thickness which is left in the vicinity of the interface 8 is exposed. Thereby, the surface Si layer 3 is thinned.

At this time, the thickness of the thinned surface Si layer 3 is preferably set to approximately 6 nm to 40 nm, more preferably approximately 8 nm to 30 nm, even more preferably approximately 10 nm to 27 nm.

This is because, if the thickness of the thinned surface Si layer 3 is less than 6 nm, the residual Si layer 5 of a sufficient thickness cannot remain in the next converting step, and moreover, the primary single crystal SiC layer 6 of a sufficient thickness cannot be generated. On the other hand, it is because, if the thickness of the thinned surface Si layer 3 exceeds 40 nm, a denaturing treatment described later may take time or the residual Si layer 5 becomes too thick and easily causes defects such as voids in the vicinity of the interface 8.

The thickness of the surface Si layer 3 after the thinning process can be set by adjusting oxidation treatment conditions such as an atmosphere, temperature, and time period for heating the Si substrate 1 in the oxidation atmosphere to form the oxide layer 9, and adjusting the thickness of the oxide layer 9 formed with respect to the original thickness of the surface Si layer 3.

Next, the Si substrate 1 is heated in the carbon-series gas atmosphere to convert the surface Si layer 3 into the single crystal SiC layer 6.

Figure 2:
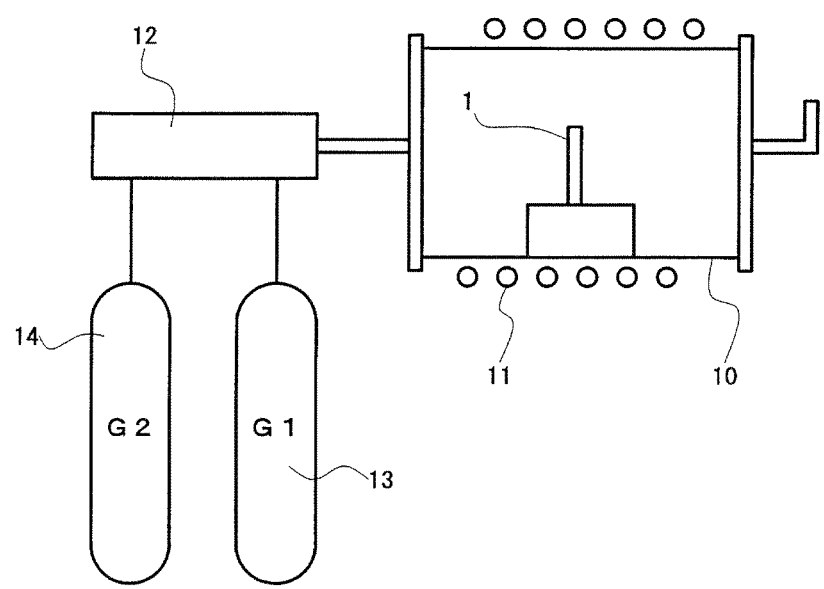
FIG. 2 is a diagram showing an apparatus used for the method for manufacturing the nitrogen compound semiconductor substrate.

The converting step is performed, for example, by an apparatus shown in FIG. 2. This apparatus includes a heating furnace 10 having a heater 11, and canisters 13 and 14 for storing the atmosphere gas (hydrogen gas G1 and hydrocarbon gas G2) to be introduced into the heating furnace 10. The numeral 12 indicates a mixer for mixing the hydrogen gas G1 and hydrocarbon gas G2 and supplying it as a mixture gas to the heating furnace 10.

With the apparatus, the Si substrate 1 is placed inside the heating furnace 10, and while the mixture gas (G1+G2) of the hydrogen gas G1 and hydrocarbon-series gas G2 are supplied into the heating furnace 10, a temperature of the atmosphere inside the heating furnace 10 is increased to convert the surface Si layer 3 of the Si substrate 1 into the single crystal SiC layer 6.

Describing in more detail, the Si substrate 1 is placed inside the heating furnace 10, and the mixture gas (G1+G2) which mixed hydrocarbon-series gas G2 at a rate of 1 vol % with respect to the hydrogen gas G1 is supplied into the heating furnace 10. Further, along with the supply of the mixture gas (G1+G2), the atmosphere temperature inside the heating furnace 10 is increased to a temperature between 500° C. and below the melting temperature of silicon, and, preferably 1200 to 1405° C. By this heating, the surface Si layer 3 of the Si substrate 1 is converted into the single crystal SiC layer 6.

Here, the hydrogen gas G1 is a carrier gas, and for the hydrocarbon-series gas G2, propane gas is used, for example. For example, if the amount of supply from the canister 13 of hydrogen gas G1 is 1000 cc per minute, the amount of supply from the canister 14 of hydrocarbon gas G2 is set to be 10 cc per minute. The thickness of the single crystal SiC layer 6 is, in purpose of reducing deficits and defects of this layer and suppressing three-dimensional growth thereof, preferably set to be approximately 3 nm to 20 nm, more preferably approximately 4 nm to 10 nm, and even more preferably approximately 5 nm to 7 nm.

At this time, in the surface Si layer 3, the residual Si layer 5 is left in the vicinity area of the interface 8 of the surface Si layer 3 and the embedded insulating layer 4. The thickness of the residual Si layer 5 is preferably set to 3 to 20 nm, and more preferably 3 to 17 nm This is because, if the thickness of the residual Si layer 5 is less than 3 nm, an effect for improving a flatness of the interface 8 of the residual Si layer 5 and the embedded insulating layer 4 is scarce, and if the thickness of the residual Si layer 5 exceeds 20 nm, defects such as voids are easily caused in the vicinity of the interface 8.

The thickness of the residual Si layer 5 can be set by adjusting conditions such as an atmosphere, temperature, and time period for the denaturing treatment to adjust the thickness of the single crystal SiC layer 6 formed with respect to the thickness of the surface Si layer 3 after the thinning process.

If needed, the above step is excessively performed to accumulate more single crystal SiC layers 6 on the single crystal SiC layer 6. By excessively performing the step (for example, continue for several minutes to several hours), a carbon thin film is accumulated on the single crystal SiC layer 6.

Subsequently, by the epitaxial growth using the single crystal SiC layer 6 as the seed layer, single crystal SiC is grown and the single crystal SiC epitaxial layer 7 is accumulated.

In the epitaxial growth of the single crystal SiC epitaxial layer 7, the single crystal SiC can be grown with conditions as follows, for example. That is, the Si substrate 1 formed with the single crystal SiC layer 6 is arranged inside a treatment chamber, and, by treating raw material gas containing hydrocarbon series, such as monomethylsilane or silane, and propane at a temperature of 500° C. to below the melting temperature of silicon, preferably 800 to 1405° C. while supplying the gas into the treatment chamber at a flow rate of approximately 1 to 1000 sccm under a pressure below the atmospheric pressure, epitaxial growth can be carried out on the single crystal SiC layer 6 as the seed layer to grow the single crystal SiC.

Here, the Si part constituting SiC and the embedded insulating layer 4 ($SiO_2$) formed by the denaturing treatment and the epitaxial growth is considered to partly become $CO_2$ and sublimates by the temperature rising. In addition, it is considered that, if SiC and $SiO_2$ are exposed to the temperature rising in a state where they contact to each other, SiC and $SiO_2$ will mutually denature.

At this time, if the residual. Si layer 5 does not exist between the single crystal SiC layer 6 and the embedded insulating layer 4 ($SiO_2$), it is considered that a part of SiC for forming the single crystal SiC layer 6 will denature into $SiO_2$ or, on the contrary, a part of $SiO_2$ for constituting the embedded insulating layer 4 will denature into SiC, and, as a result, the flatness of an interface of the single crystal SiC layer 6 and the embedded insulating layer 4 will collapse and appear as a "waviness".

Thus, like the aspect of the invention, it is considered, with the existence of the residual Si layer 5 of a suitable thickness between the single crystal SiC layer 6 and the embedded insulating layer 4 ($SiO_2$) after the denaturing treatment, the mutual denature between SiC and $SiO_2$ as described above can be prevented, and the flatness of the interface 8 of the residual Si layer 5 and the embedded insulating layer 4 can be maintained. Further, it is considered, even if some kind of defects occur in the single crystal SiC layer 6 after the denaturing treatment, the defects do not reach the embedded insulating layer 4 because of the existence of the residual Si layer 5, the sublimation of Si can be prevented, and the flatness of the interface 8 of the residual Si layer 5 and the embedded insulating layer 4 can be maintained.

When the flatness of the interface 8 of the residual Si layer 5 and the embedded insulating layer 4 is maintained, it is considered that the thickness of the single crystal SiC layer 6 obtained by the denaturing treatment becomes uniform and the crystal faces become oriented in the same direction. In this way, the crystallinity of SiC of the oriented state is maintained even when the single crystal SiC is grown by the epitaxial growth later, therefore, the single crystal SiC epitaxial layer 7 having the single crystal which is far more beautiful than the conventional one and having the uniform film thickness can be obtained.

Next, as shown in FIG. 1(D), on the single crystal SiC epitaxial layer 7, the nitrogen compound semiconductor layer 15 is accumulated by the epitaxial growth.

The epitaxial growth of the nitrogen compound semiconductor layer 15 can be performed under conditions as follows. That is, the Si substrate 1 formed with the single crystal SiC epitaxial layer 7 is arranged inside the treatment chamber. By supplying raw material gas containing organic A1-series gas and/or organic Ga-series gas, and ammonia gas into the treatment chamber at a gas flow rate of approximately 100 to 5000 sccm under a pressure below the atmospheric pressure to be treated at a temperature between 500° C. to below the melting temperature of silicon, preferably approximately 400 to 1200° C., the epitaxial growth is carried out on the single crystal SiC epitaxial layer 7 and, thus, the nitrogen compound semiconductor layer 15, which is any of an AlN layer, a GaN layer, an AlGaN layer and the like, or such a laminated structure of these layers, can be grown.

Figure 3:
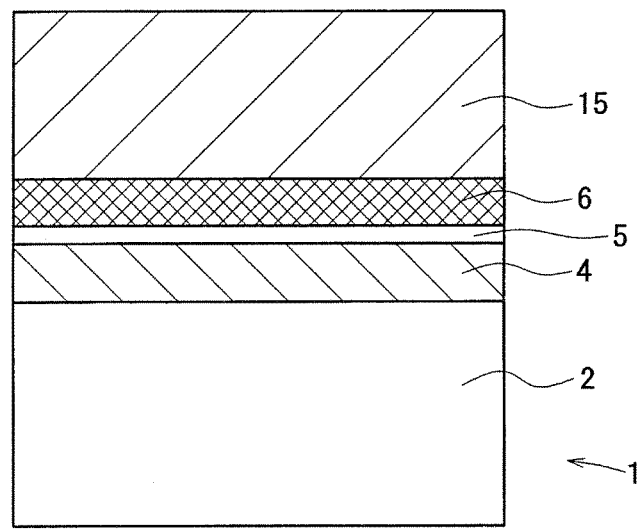
FIG. 3 is a view showing a method for manufacturing a nitrogen compound semiconductor substrate according to a second embodiment of the invention.

FIG. 3 shows a second embodiment according to the present invention.

In this example, the Si substrate 1 having the embedded insulating layer 4 is heated in the carbon-series gas atmosphere to convert the surface Si layer 3 into the single crystal SiC layer 6, and then, without growing SiC by the epitaxial growth, the epitaxial growth is performed on the single crystal SiC layer 6 to grow the nitrogen compound semiconductor layer 15 as described above. Other than that, this embodiment is similar to the above embodiment.

In each embodiment, although any of the AlN layer, the GaN layer, the AlGaN layer and the like, or such the laminated structure of these layers is illustrated as the nitrogen compound semiconductor layer 15, it is not limited to these and may be able to apply other various kinds of nitrogen compound semiconductor.

By doing this, when converting the surface Si layer 3 into the single crystal SiC layer 6, by leaving the Si layer in the vicinity of the interface 8 with the embedded insulating layer 4 as the residual Si layer 5, the flatness of the interface 8 with the embedded insulating layer 4 below the residual Si layer 5 can dramatically be improved, and the "waviness" in the interface 8 can dramatically be decreased. Thus, since the flatness of the interface 8 of the embedded insulating layer 4 and the residual Si layer 5 improves, the "waviness" which occurs in the single crystal SiC layer 6 itself formed on the surface of the residual Si layer 5 can dramatically be suppressed. Thus, since the single crystal SiC layer 6 with less waviness is formed, the nitrogen compound semiconductor layer 15 formed by the epitaxial growth on the single crystal SiC layer 6 is also dramatically improved in crystallinity, and a performance as a semiconductor device can dramatically be improved. Moreover, it does not depend on an ion implantation or the like, the nitrogen compound semiconductor substrate as the high quality semiconductor device described above can be manufactured with low cost and high productivity.

Further, if epitaxially growing single crystal SiC on the denatured single crystal SiC layer 6 and further epitaxially growing the nitrogen compound semiconductor on the epitaxially-grown single crystal SiC, when forming SiC as an upper layer of the single crystal SiC layer 6 by the epitaxial growth, because the crystallinity of the growing SiC improves, the crystallinity of the nitrogen compound semiconductor layer 15 epitaxially grown on SiC becomes high, and, a good nitrogen compound semiconductor device can be obtained.

When the thickness of the residual Si layer 5 is 3 to 20 nm, an effect for improving the flatness of the interface 8 of the embedded insulating layer 4 and the residual Si layer 5, and the single crystal SiC layer 6 itself can sufficiently be obtained, and defects such as voids are hardly caused in the lower layers of the single crystal SiC layer 6. Therefore, a good nitrogen compound semiconductor device can be obtained.

Example A

Example A1

A (111) SIMOX substrate of which the thickness of the surface Si layer 3 therein is 10 to 14 nm (SOI-A) and a (111) SIMOX substrate of which the thickness of the surface Si layer 3 therein is 18 to 22 nm (SOI-B) are prepared as starting materials. Each SOI substrate is inserted into an electric furnace as a specimen, and propane and hydrogen gas are introduced into the electric furnace at flow rates of 100 sccm and 10 SLM respectively so that an atmosphere in the electric furnace is heated to reach a temperature of 1250° C., then kept for 15 minutes at the same temperature.

By this step, a silicon layer of 3 to 7 nm from the surface side of each surface Si layer 3 is carbonized to convert it into the single crystal SiC layer 6 of 3 to 7 nm thickness (seed layer). Thereby, SOI-A and SOI-B have a film structure in which the residual Si layers 5 of 3 to 11 nm, 9 to 19 nm remains in the lower layer parts thereof, respectively.

Then, the power feed to the heater for heating the electric furnace is stopped, and while the introduction of both gases is stopped at the same time, nitrogen at a flow rate of 10 SLM is introduced into the furnace to replace both gases with the nitrogen. After the atmosphere temperature in the electric furnace is cooled to 700° C. in the above state, the introduction of the nitrogen gas is stopped while keeping the atmosphere temperature at 700° C. and oxygen gas at a flow rate of 10 sccm is introduced for one hour at the same time. Because excessive carbon adheres onto the surface of specimen when SiC is generated by the introduction of the propane gas, the oxygen gas is introduced so that the excessive carbon reacts with oxygen to generate $CO_2$ and the excessive carbon is effectively removed. Subsequently, the introduction of oxygen is stopped, nitrogen gas at a flow rate of 4 SLM is introduced again to cool the specimen until it reaches a predetermined low temperature as a whole, for example approximately 80° C., and a wafer is then taken out from the furnace.

Continuously, the wafer is inserted into a depressurized epitaxial-growth furnace and heated so that a temperature of the wafer reaches 400° C. while 3 sccm of dimethyl aluminum hydride gas and 100 sccm of ammonia gas are introduced into the epitaxial-growth furnace under depressurizing at approximately $1 \times 10^{-2}$ torr, and then, the wafer is kept for one minute at the same temperature to accumulate thereon an AlN buffer layer of approximately 3 nm thickness. Then, the power feed to the heater for heating the epitaxial-growth furnace is stopped and the introduction of dimethyl aluminum hydride gas and ammonia gas is stopped at the same time, the specimen in the electric furnace is cooled in the state until it reaches a predetermined low temperature as a whole, for example approximately 80° C., and the wafer is then taken out from the furnace.

Continuously, the wafer is inserted into the depressurized epitaxial-growth furnace and heated so that the temperature of the wafer reaches 980° C. while 1 sccm of trimethylgallium gas and 15 SLM of ammonia gas are introduced into the epitaxial-growth furnace under depressurizing at approximately 1 torr, and then, the wafer is kept for 75 minutes at the same temperature to accumulate thereon a GaN epitaxial layer of approximately 300 nm thickness. Then, the power feed to the heater for heating the epitaxial-growth furnace is stopped and the introduction of trimethylgallium gas and ammonia gas is stopped at the same time, the specimen in the electric furnace is cooled in the state until it reaches a predetermined low temperature as a whole, for example approximately 80° C., and the wafer is then taken out from the furnace.

Comparative Example A1

A (111) SIMOX substrate of which a thickness of the surface Si layer 3 therein is 3 to 7 nm (SOI-Ref) is prepared as a starting material, and the SOI substrate is inserted into the electric furnace as a specimen to operate a carbonization and heat treatment under the same condition with the Example A1. By this step, the surface Si layer 3 thereof is completely carbonized, converted into the single crystal SiC layer 6 of 3 to 7 nm thickness, and became a structure in which a lower layer part thereof directly contacts with the embedded insulating layer 4. Continuously, the wafer is inserted into the depressurized epitaxial-growth furnace to accumulate thereon an AlN buffer layer of approximately 3 nm thickness under the same condition with the Example A1. Continuously, the wafer is inserted into the depressurized epitaxial-growth furnace to accumulate thereon a GaN epitaxial layer of approximately 300 nm thickness under the same condition with the Example A1.

Example A2

A (111) SIMOX substrate of which the thickness of the surface Si layer 3 therein is 10 to 14 nm (SOI-A) and a (111) SIMOX substrate of which the thickness of the surface Si layer 3 therein is 18 to 22 nm (SOI-B) are prepared as starting materials, and are operated a carbonization and heat treatment under the same condition with the Example A1. By this step, a silicon layer of 3 to 7 nm from the surface side of each surface Si layer 3 is carbonized to convert it into the single crystal SiC layer 6 of 3 to 7 nm thickness. Thereby, SOI-A and SOI-B have a film structure in which the residual Si layers 5 of 3 to 11 nm and 9 to 19 nm remains in the lower layer parts thereof, respectively.

Continuously, the wafer is inserted into the depressurized epitaxial-growth furnace and heated so that the temperature of the wafer reaches 1150° C. while 3 sccm of monomethylsilane is introduced into the epitaxial-growth furnace under depressurizing at approximately $2 \times 10^{-4}$ torr, and then, the wafer is kept for 10 minutes at the same temperature to accumulate the single crystal SiC epitaxial layer 7 of approximately 100 nm thickness on the single crystal SiC layer 6 (seed layer).

Then, the power feed to the heater for heating the epitaxial-growth furnace is stopped and the introduction of monomethylsilane is stopped at the same time, the specimen in the electric furnace is cooled in the state until it reaches a predetermined low temperature as a whole, for example approximately 80° C., and then the wafer is then taken out from the furnace. Continuously, the wafer is inserted into the depressurized epitaxial-growth furnace to accumulate thereon an AlN buffer layer of approximately 3 nm thickness under the same condition with the Example A1. Continuously, the wafer is inserted into the depressurized epitaxial-growth furnace to accumulate thereon a GaN epitaxial layer of approximately 300 nm thickness under the same condition with the Example A1.

Comparative Example A2

A (111) SIMOX substrate of which a thickness of the surface Si layer 3 is 3 to 7 nm (SOI-Ref) is prepared as a starting material, and the SOI substrate is inserted into the electric furnace as a specimen to operate a carbonization and heat treatment under the same condition with the Example A1. By this step, the surface Si layer 3 thereof is completely carbonized to convert it into the single crystal SiC layer 6 of 3 to 7 nm thickness, and became a structure in which a lower layer part thereof directly contacts with the embedded insulating layer 4.

Continuously, the wafer is inserted into the depressurized epitaxial-growth furnace to accumulate thereon the single crystal SiC epitaxial layer 7 of approximately 100 nm thickness under the same condition with the Example A2. Continuously, the wafer is inserted into the depressurized epitaxial-growth furnace to accumulate thereon an AlN buffer layer of approximately 3 nm thickness under the same condition with the Example A1. Continuously, the wafer is inserted into the depressurized epitaxial-growth furnace to accumulate thereon a GaN epitaxial layer of approximately 300 nm thickness under the same condition with the Example A1.

Evaluation Immediately after Single Crystal Sic Layer is Formed in Example A1 and Comparative Example A1

Evaluation by a cross-sectional TEM image observation is performed about each sample immediately after the single crystal SiC layer 6 (seed layer) is formed by the methods of Example A1 and Comparative Example A1.

Figure 4:
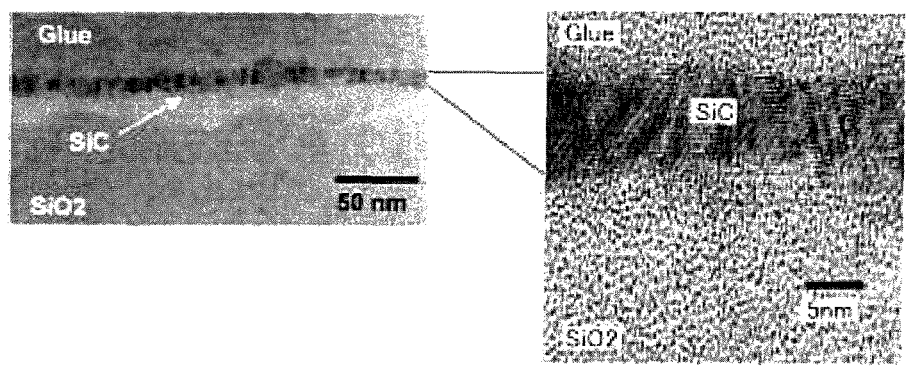
FIG. 4 is cross-sectional TEM images of a sample immediately after a single crystal SiC layer is formed by a method of Comparative Example 1 in which SOI-Ref is used as a starting material.

The cross-sectional TEM images of the sample immediately after the single crystal SiC layer 6 (seed layer) is formed by the method of Comparative Example A1 in which SOI-Ref is used as the starting material is shown in FIG. 4. In the view, the single crystal SiC layer 6 of approximately 5 nm thickness (seed layer) is directly formed on the embedded insulating layer 4, and a large waviness of approximately 10 nm has occurred in the interface of an upper part of the embedded insulating layer 4. As a result, a waviness of approximately 10 nm is seen in the single crystal SiC layer 6 itself (seed layer), and a clear disarray in SiC orientation is seen in the lattice image by the cross-sectional TEM.

Figure 5:
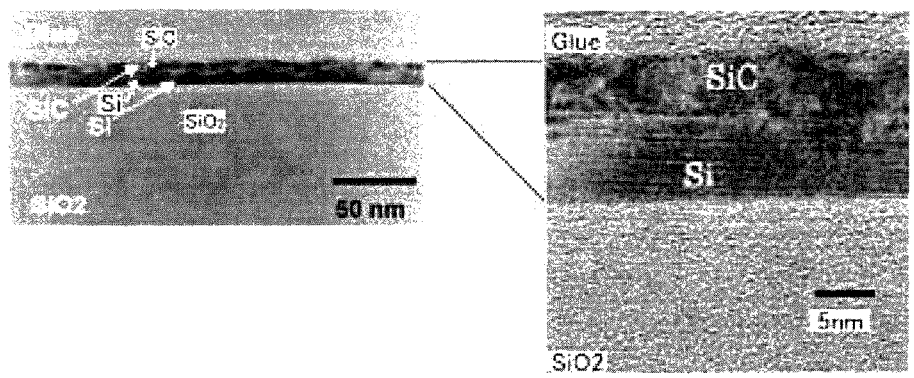
FIG. 5 is cross-sectional TEM images of a sample immediately after a single crystal SiC layer is formed by a method of Example 1 in which SOI-A is used as a starting material.

The cross-sectional TEM images of the sample immediately after the single crystal SiC layer 6 (seed layer) is formed by the method of Example A1 in which SOI-A is used as the starting material is shown in FIG. 5. The residual Si layer 5 of 3 to 11 nm thickness is left as the lower layer of the single crystal SiC layer 6 of 3 to 7 nm thickness (seed layer), thereby, the flatness of the interface 8 with the embedded insulating layer 4 below the residual Si layer 5 is improved and the waviness in the interface 8 is suppressed to less than 3 nm. As a result, the waviness in the single crystal SiC layer 6 (seed layer) is also suppressed to a level of less than 3 nm substantially equivalent to the waviness of the interface 8 described above. Also in the lattice image by the cross-sectional TEM, an improvement in the orientation of SiC is seen comparing with the Comparative Example.

In the sample immediately after the single crystal SiC layer 6 (seed layer) is formed by the method of Example A1 in which SOI-B is used as the starting material, the residual Si layer 5 is left similarly to above, thereby, the flatness of the interface 8 with the embedded insulating layer 4 below the residual Si layer 5 is improved and the waviness in the interface 8 is suppressed to less than 3 nm. Also in the lattice image by the cross-sectional TEM, an improvement in the orientation of SiC is seen comparing with the Comparative Example. As a result, the waviness in the single crystal SiC is layer 6 (seed layer) is also suppressed to a level of less than 3 nm substantially equivalent to the waviness of the interface 8 described above. Also in the lattice image by the cross-sectional TEM, an improvement in the orientation of SiC comparing with the Comparative Example is seen. In a table A1 below, the evaluation results immediately after the SiC seed layer is formed in the Example A1 and Comparative Example A1 are summarized.

TABLE A1

| Starting Material | SOI-A | SOI-B | SOI-Ref |
|---|---|---|---|
| Waviness in Interface of Upper Part of Embedded Oxide Film | O (less than 3 nm) | O (less than 3 nm) | X (approx 10 nm) |
| Waviness of Single Crystal SiC Seed Layer Itself | O (less than 3 nm) | O (less than 3 nm) | X (approx 10 nm) |

Evaluation Immediately after SiC Epitaxial Layer is Formed in Example A2 and Comparative Example A2

Evaluation by an observation of cross-sectional TEM images and evaluation by the X-ray diffraction rocking curve method are performed about samples immediately after the SiC epitaxial layer is formed by the methods of Example A2 and Comparative Example A2.

Figure 6:
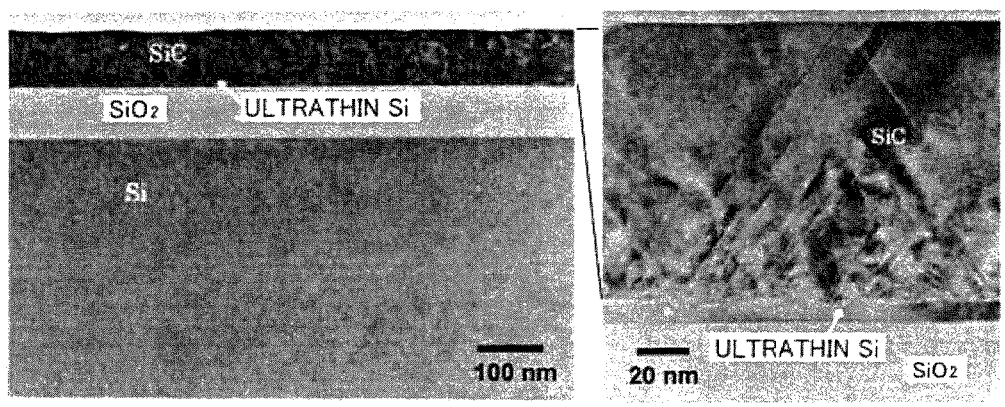
FIG. 6 is cross-sectional TEM images of a sample immediately after an SiC epitaxial layer is formed by a method of Example 2 in which SOI-A is used as a starting material.

The cross-sectional TEM images of the sample immediately after the to SiC epitaxial layer is formed by the method of Example A2 in which SOI-A is used as the starting material is shown in FIG. 6. The single crystal SiC epitaxial layer 7 of approximately 100 nm thickness is formed above the single crystal SiC layer 6 (seed layer), and the residual Si layer 5 of 3 to 7 nm thickness is left in the lower layer part thereof. The good flatness of the interface 8 of the upper part of the embedded insulating layer 4 indicated in the Example A1 is maintained even after the SiC epitaxial step is subsequently executed.

Similarly, even when SOI-B is used as the starting material, it is confirmed that the good flatness of the interface 8 of the upper part of the embedded insulating layer 4 is maintained even after the SiC epitaxial step is operated.

Each half width of SiC (111) peaks in the single crystal SiC epitaxial layers 7 by the methods of Example A2 and Comparative Example A2 is evaluated by the X-ray diffraction rocking curve method. The evaluation results are summarized in a table A2 below. It is confirmed that the half width of the single crystal SiC epitaxial layer 7 in the Example A2 is the value of approximately 70% of the half width of the single crystal SiC epitaxial layer 7 formed on the specimen of the Comparative Example A1 under the same conditions with the above, and, by leaving the residual Si layer 5 in the lower part of the single crystal SiC layer 6 (seed layer), the crystal quality of the single crystal SiC epitaxial layer 7 improves.

TABLE A2

| Starting Material | SOI-A | SOI-B | SOI-Ref |
|---|---|---|---|
| SiC (111) Peak Half Width by X-ray Diffraction (Standardized with Half Width of SOI-Ref) | 0.7 | 0.7 | 1 |

Evaluation after GaN Epitaxial Layer if Formed in Examples A1 and A2, and Comparative Examples A1 and A2

Evaluation by an observation of cross-sectional TEM images and evaluation by the X-ray diffraction rocking curve method are performed about samples after the GaN epitaxial layer is formed by the methods of Examples A1 and A2, and Comparative Examples A1 and A2.

Figure 7:
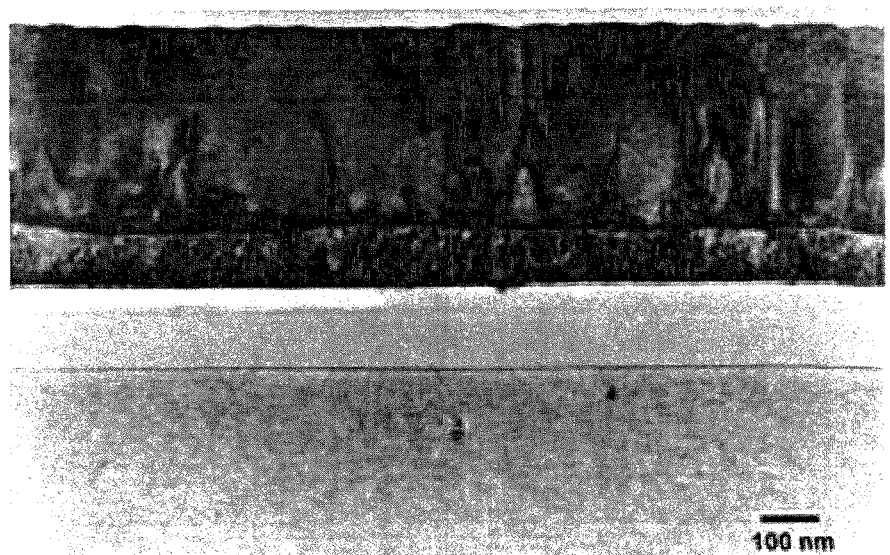
FIG. 7 is a cross-sectional TEM image of a sample immediately after a GaN epitaxial layer is formed by the method of Example 2 in which SOI-A is used as the starting material.

The cross-sectional TEM image of the sample after the GaN epitaxial layer is formed by the method of Example A2 in which SOI-A is used as the starting material is shown in FIG. 7. The single crystal GaN epitaxial layer of approximately 300 nm thickness is formed, via the AlN buffer layer of approximately 3 nm thickness, above the single crystal SiC epitaxial layer 7 of approximately 100 nm thickness on the single crystal SiC layer 6 (seed layer), and, the residual Si layer 5 of approximately 7 nm thickness is left as the lower layer thereof. The good flatness of the interface 8 of the upper part of the embedded insulating layer 4 is maintained even after the GaN epitaxial step is subsequently executed.

Similarly, also in the samples after the GaN epitaxial layer is formed by the method of the Example A1 in which SOI-A is used as the starting material and the methods of the Examples A1 and A2 in which SOI-B is used as the starting materials respectively, the good flatness of the interface 8 of the upper part of the embedded insulating layer 4 is maintained even after the GaN epitaxial step is subsequently executed.

Each half width of GaN (0004) peaks of GaN epitaxial layers in the Examples A1 and A2, and Comparative Examples A1 and A2 is evaluated by the X-ray diffraction rocking curve method. The evaluation results are summarized in tables A3 and A4 below.

TABLE A3

| Starting Material | SOI-A | SOI-B | SOI-Ref |
|---|---|---|---|
| GaN (0004) Peak Half Width by X-ray Diffraction (Standardized with Half Width of SOI-Ref) | 0.8 | 0.8 | 1 |

TABLE A4

| Starting Material | SOI-A | SOI-B | SOI-Ref |
|---|---|---|---|
| GaN (0004) Peak Half Width by X-ray Diffraction (Standardized with Half Width of SOI-Ref) | 0.7 | 0.8 | 1 |

It is confirmed that the half widths of the GaN epitaxial layers in the Examples A1 and A2 are the values of approximately 70 to 80% of the half widths of the GaN epitaxial layers formed on the specimen of the Comparative Examples A1 and A2 under the same conditions with the above, and by leaving the residual Si layer 5 below the single crystal SiC layer 6 (seed layer), the crystal quality of the GaN epitaxial layer improves.

Figure 8:
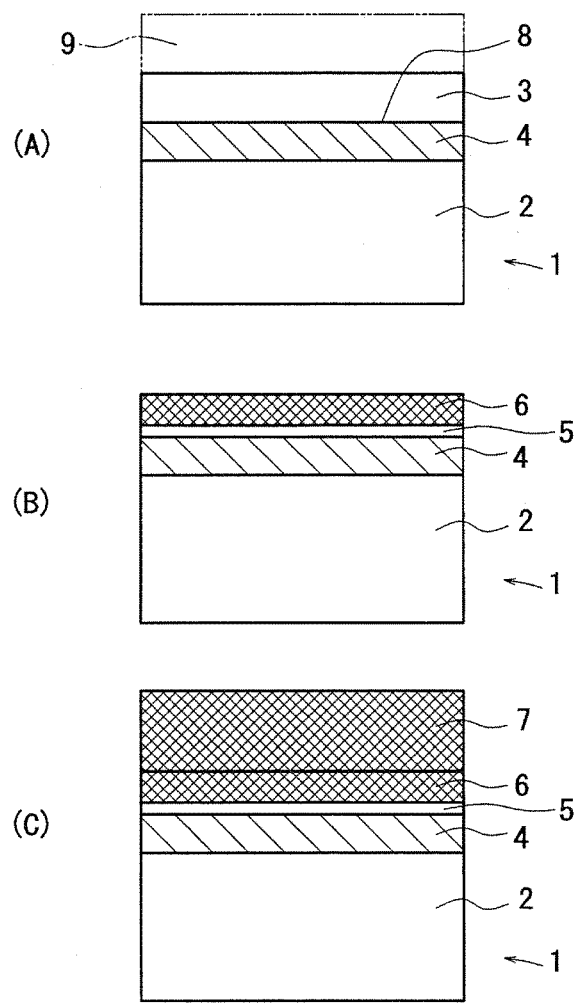
FIGS. 8(A) to 8(C) are views showing a method for manufacturing a single crystal SiC substrate according to one embodiment of the present invention.

FIGS. 8(A) to 8(C) are views showing another embodiment of a method for manufacturing a single crystal SiC substrate according to the invention.

In method for manufacturing the single crystal SiC substrate, firstly, an Si substrate 1 including a surface Si layer of a predetermined thickness and an embedded insulating layer 4 is prepared, and the thickness of the surface Si layer 3 of the Si substrate 1 is thinned to be approximately 6 nm to 40 nm (FIG. 8(A)). Next, the Si substrate 1 is heated in a carbon-series gas atmosphere to convert the surface Si layer 3 into a single crystal SiC layer 6 (FIG. 8(B)). At this time, the Si layer in the vicinity of an interface 8 with the embedded insulating layer 4 is left as a residual Si layer 5. Subsequently, by an epitaxial growth, a single crystal SiC epitaxial layer 7 is grown on the single crystal SiC layer 6 as a seed layer (FIG. 8(C)).

Hereinafter, each step is described in detail.

The Si substrate 1 is formed with an $SiO_2$ layer of a predetermined thickness as the embedded insulating layer 4 in the vicinity of a surface of an Si base material 2, and formed with the surface Si layer 3 of the predetermined thickness on the surface of the $SiO_2$ layer. The thickness of the embedded insulating layer 4 is set to be approximately 1 to 200 nm.

Subsequently, a thinning process is carried out for the thickness of the surface Si layer 3 of the Si substrate 1. The thinning process is performed in a manner in which, for example, by heat-treating the Si substrate 1 in an oxidation atmosphere, the surface Si layer 3 is oxidized from the surface thereof by a predetermined depth to form an oxide layer 9 so that the Si layer of a desired thickness remains in the vicinity of the interface 8 with the embedded insulating layer 4. Then, the oxide layer 9 on the surface is etched by a hydrofluoric acid or the like to be removed, and the Si layer of the desired thickness which is left in the vicinity of the interface 8 is exposed. Thereby, the surface Si layer 3 is thinned.

At this time, the thickness of the thinned surface Si layer 3 is preferably set to approximately 6 nm to 40 nm, more preferably approximately 8 nm to 30 nm, even more preferably approximately 10 nm to 27 nm This is because, if the thickness of the thinned surface Si layer 3 is less than 6 nm, the residual Si layer 5 of a sufficient thickness cannot remain in the next converting step, and moreover, the primary single crystal SiC layer 6 of a sufficient thickness cannot be generated. On the other hand, it is because, if the thickness of the thinned surface Si layer 3 exceeds 40 nm, a denaturing treatment described later may take time or the residual Si layer 5 becomes too thick and easily causes defects such as voids in the vicinity of the interface 8.

The thickness of the surface Si layer 3 after the thinning process can be set by adjusting the oxidation treatment condition such as an atmosphere, temperature, and time period for heating the Si substrate 1 in the oxidation atmosphere to form the oxide layer 9, and adjusting the thickness of the oxide layer 9 formed with respect to the original thickness of the surface Si layer 3.

Next, the Si substrate 1 is heated in the carbon-series gas atmosphere to convert the surface Si layer 3 into the single crystal SiC layer 6.

Figure 9:
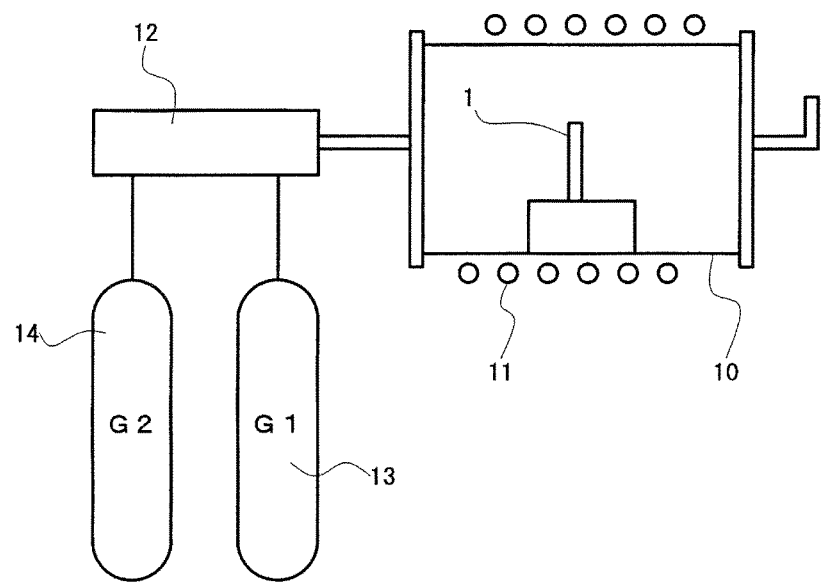
FIG. 9 is a diagram showing an apparatus used for the method for manufacturing the single crystal SiC substrate.

The converting step is performed, for example, by an apparatus shown in FIG. 9. This apparatus includes a heating furnace 10 having a heater 11, and canisters 13 and 14 for storing the atmosphere gas (hydrogen gas G1 and hydrocarbon gas G2) to be introduced into the heating furnace 10. The numeral 12 in the figure indicates a mixer for mixing the hydrogen gas G1 and hydrocarbon gas G2 and supplying it as a mixture gas to the heating furnace 10.

With the apparatus, the Si substrate 1 is placed inside the heating furnace 10, and while the mixture gas (G1+G2) of the hydrogen gas G1 and hydrocarbon-series gas G2 is supplied into the heating furnace 10, a temperature of the atmosphere inside the heating furnace 10 is increased to convert the surface Si layer 3 of the Si substrate 1 into the single crystal SiC layer 6.

Describing in more detail, the Si substrate 1 is placed inside the heating furnace 10, and the mixture gas (G1+G2) which mixed hydrogen gas G2 at a rate of 1 vol % with respect to the hydrogen gas G1 is supplied into the heating furnace 10. Further, along with the supply of the mixture gas (G1+G2), the atmosphere inside the heating furnace 10 is increased to a temperature between 500° C. and below the melting temperature of silicon, and, preferably 1200 to 1405° C. By this heating, the surface Si layer 3 of the Si substrate 1 is converted into the single crystal SiC layer 6.

Here, the hydrogen gas G1 is a carrier gas, and for the hydrocarbon-series gas G2, propane gas is used, for example. For example, if the amount of supply from the canister 13 of hydrogen gas G1 is 1000 cc per minute, the amount of supply from the canister 14 of hydrocarbon gas G2 is set to be 10 cc per minute. The thickness of the single crystal SiC layer 6 is, in purpose of reducing deficits and defects of this layer and suppressing three-dimensional growth thereof, preferably set to be approximately 3 nm to 20 nm, more preferably approximately 4 nm to 10 nm, and even more preferably approximately 5 nm to 7 nm.

At this time, in the surface Si layer 3, the residual Si layer 5 is left in the vicinity area of the interface 8 of the surface Si layer 3 and the embedded insulating layer 4. The thickness of the residual Si layer 5 is preferably set to 3 to 20 nm, and more preferably 3 to 17 nm. This is because, if the thickness of the residual Si layer 5 is less than 3 nm, an effect for improving a flatness of the interface 8 of the residual Si layer 5 and the embedded insulating layer 4 is scarce, and if the thickness of the residual Si layer 5 exceeds 20 nm, defects such as voids are easily caused in the vicinity of the interface 8.

The thickness of the residual Si layer 5 can be set by adjusting conditions such as an atmosphere, temperature, and time period the denaturing treatment to adjust the thickness of the single crystal SiC layer 6 formed with respect to the thickness of the surface Si layer 3 after the thinning process.

If needed, the above step is excessively performed so as to accumulate more single crystal SiC layers 6 on the single crystal SiC layer 6. By excessively performing the step (for example, continue for several minutes to several hours), a carbon thin film is accumulated on the single crystal SiC layer 6.

Subsequently, by the epitaxial growth using the single crystal SiC layer 6 as the seed layer, single crystal SiC is grown and the single crystal SiC epitaxial layer 7 is accumulated.

In the epitaxial growth, the single crystal SiC can be grown with conditions as follows, for example. That is, the Si substrate 1 formed with the single crystal SiC layer 6 is arranged inside a treatment chamber, and, by treating raw material gas containing hydrocarbon series, such as monomethylsilane or silane, and propane at a temperature of 500° C. to below the melting temperature of silicon, preferably 800 to 1405° C. while supplying the gas into the treatment chamber at a gas flow rate of approximately 1 to 1000 sccm under a pressure below the atmospheric pressure, epitaxial growth can be carried out on the single crystal SiC layer 6 as the seed layer to grow the single crystal SiC.

Here, the Si part for constituting SiC and the embedded insulating layer 4 ($SiO_2$) formed by the denaturing treatment and the epitaxial growth is considered to partly become $CO_2$ and sublimates by the temperature rising. In addition, it is considered that, if SiO and $SiO_2$ are exposed to the temperature rising in a state where they contact to each other, SiC and SiO, will mutually denature.

At this time, if the residual Si layer 5 does not exist between the single crystal SiC layer 6 and the embedded insulating layer 4 ($SiO_2$), it is considered that a part of SiC for forming the single crystal SiC layer 6 will denature into $SiO_2$ or, on the contrary, a part of $SiO_2$ for forming the embedded insulating layer 4 will denature into SiC, and, as a result, the flatness of an interface of the single crystal SiC layer 6 and the embedded insulating layer 4 will collapse and appear as a "waviness".

Thus, like the aspect of the invention, it is considered, with the existence of the residual Si layer 5 of a suitable thickness between the single crystal SiC layer and the embedded insulating layer 4 ($SiO_2$) after the denaturing treatment, the mutual denature between SiC and $SiO_2$ as described above can be prevented, and the flatness of the interface 8 of the residual Si layer 5 and the embedded insulating layer 4 can be maintained. Further, it is considered, even if some kind of defects occur in the single crystal SiC layer 6 after the denaturing treatment, the defects do not reach the embedded insulating layer 4 because of the existence of the residual Si layer 5, the sublimation of Si can be prevented, and the flatness of the interface 8 of the residual Si layer 5 and the embedded insulating layer 4 can be maintained.

When the flatness of the interface 8 of the residual Si layer 5 and the embedded insulating layer 4 is maintained, it is considered that the thickness of the single crystal SiC layer 6 obtained by the denaturing treatment becomes uniform and the crystal faces become oriented in the same direction. In this way, the crystallinity of SiC of the oriented state is maintained even when the single crystal SiC is grown by the epitaxial growth later, therefore, the single crystal SiC epitaxial layer 7 having the single crystal which is far more beautiful than the conventional one and having the uniform film thickness can be obtained.

By doing this, because the residual Si layer 5 is formed in the vicinity of the interface 8 of the single crystal SiC layer 6 and the embedded insulating layer 4, the flatness of the interface 8 with the embedded insulating layer 4 in below the residual Si layer 5 and the "waviness" in the interface can dramatically be decreased. Because the flatness of the interface 8 of the embedded insulating layer 4 and the residual Si layer 5 improves, the "waviness" which occurs in the single crystal SiC layer 6 itself formed on the surface of the residual Si layer 5 can dramatically be suppressed. Thus, because the single crystal SiC layer 6 with less waviness is formed, a performance as a semiconductor device can dramatically be improved.

When further growing single crystal SiC as the upper layer of the single crystal SiC layer 6 on the surface by carrying out the epitaxial growth on the single crystal SiC substrate in which the residual Si layer 5 is left in the vicinity of the interface 8 with the embedded insulating layer 4, because the crystallinity of the growing SiC improves even when further forming SiC as the upper layer of the single crystal SiC layer 6 by the epitaxial growth as described above, SiC of beautiful single crystal and uniform thickness can be obtained.

If the thickness of the residual Si layer 5 is 3 to 20 nm, an effect for improving the flatness of the interface 8 of the embedded insulating layer 4 and the residual Si layer 5, and the single crystal SiC layer 6 itself can sufficiently be obtained, defects such as voids are hardly caused in the lower layers of the single crystal SiC layer 6, and, therefore, a good semiconductor device can be obtained.

Example B

Next, descriptions will be given about an Example B of the method of the single crystal SiC substrate in the present invention.

Example B1

A (111) SIMOX substrate of which a thickness of the surface Si layer 3 therein is 10 to 14 nm (SOI-A), a (111) SIMOX substrate of which the thickness of the surface Si layer 3 therein is 18 to 22 nm (SOI-B), and a (111) attached SOI substrate of which the thickness of the surface Si layer 3 therein is 990 to 1100 nm (SOI-C) are prepared as starting materials. Each SOI substrate is inserted into an electric furnace as a specimen, and propane and hydrogen gas are introduced into the electric furnace at flow rates of 100 sccm and 10 SLM, respectively, so that an atmosphere in the electric furnace is heated to reach a temperature of 1250° C., then kept for 15 minutes at the same temperature.

By this step, Si of 3 to 7 nm from the surface side of each surface Si layer 3 is carbonized to convert it into the single crystal SiC layer 6 of 3 to 7 nm thickness (seed layer). Thereby, SOI-A, SOI-B, and SOI-C have a film structure in which the residual Si layers 5 of 3 to 11 nm, 9 to 17 nm, and approximately 990 to 1100 nm exist in lower layer parts of the single crystal SiC layer 6 (seed layer), respectively.

Then, while the power feed to the heater for heating the electric furnace is stopped, and the introduction of both gases is stopped at the same time, nitrogen at a flow rate of 10 SLM is introduced into the furnace to replace both gases with the nitrogen. After the atmosphere temperature in the electric furnace is cooled to 700° C. in the above state, the introduction of the nitrogen gas is stopped while keeping the atmosphere temperature at 700° C. and oxygen gas at a flow rate of 10 seem is introduced for one hour at the same time. Because excessive carbon adheres onto the surface of specimen when SiC is generated by the introduction of the propane gas, the oxygen gas is introduced so that the excessive carbon reacts with oxygen to generate $CO_2$ and the excessive carbon is effectively removed. Subsequently, the introduction of oxygen is stopped, nitrogen gas at a flow rate of 4 SLM is introduced again to cool the specimen until it reaches a predetermined low temperature as a whole, for example approximately 80° C., and a wafer is then taken out from the furnace.

Comparative Example B1

A (111) SIMOX substrate of which the thickness of the surface Si layer 3 therein is 3 to 7 nm (SOI-Ref) is prepared as a starting material, and the SOI substrate is inserted into the electric furnace as a specimen to execute a carbonization and heat treatment, which is the denaturing treatment, under the same condition with the Example B1. By this step, the surface Si layer 3 is completely carbonized, converted into the single crystal SiC layer 6 of 3 to 7 nm thickness (seed layer), and became a structure in which the embedded-insulating-layer 4 in direct contact with the single crystal SiC layer 6 exists as the lower layer thereof.

Evaluation Of Example B1 and Comparative Example B1

Evaluation by a cross-sectional TEM image observation is performed about each single crystal SiC layer 6 by the methods of the Example B1 and Comparative Example B1.

Figure 10:
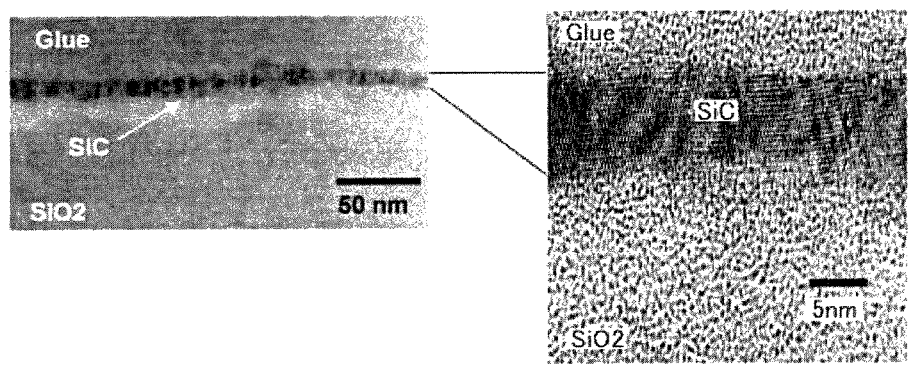
FIG. 10 is cross-sectional TEM images of a single crystal SiC layer (seed layer) by a method of Comparative Example 1 in which SOI-Ref is used as a starting material.
Figure 1:
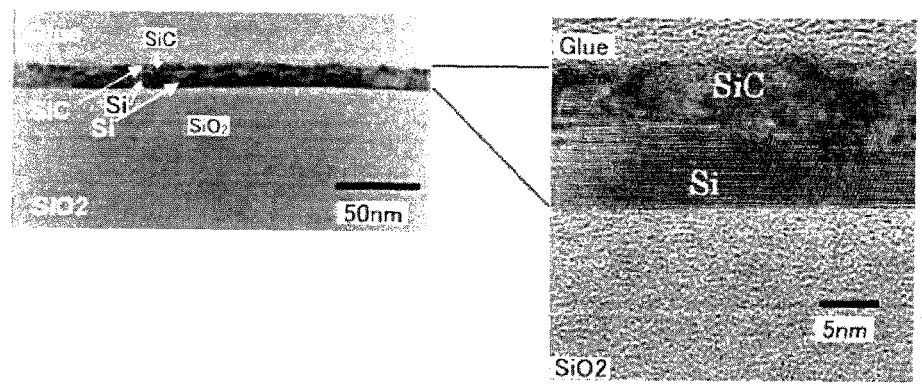

The cross-sectional TEM images of the single crystal SiC layer 6 (seed layer) by the method of Comparative Example B1 in which SOI-Ref is used as the starting material is shown in FIG. 10. In the view, the single crystal SiC layer 6 of approximately 5 nm thickness (seed layer) is directly formed on the embedded insulating layer 4, and a large waviness of approximately 10 nm has occurred in the interface of an upper part of the embedded insulating layer 4. As a result, a waviness of approximately 10 nm is seen in the single crystal SiC layer 6 itself (seed layer), and a clear disarray in SiC orientation is seen in the lattice image by the cross-sectional TEM.

The cross-sectional TEM images of the single crystal SiC layer 6 (seed layer) by the method of Example B1 in which SOI-A is used as the starting material is shown in FIG. 11. The residual Si layer 5 of 3 to 11 nm thickness is left as the lower layer of the single crystal SiC layer 6 of 3 to 7 nm thickness (seed layer), thereby, the flatness of the interface 8 with the embedded insulating layer 4 below the residual Si layer 5 is improved and the waviness in the interface 8 is suppressed to less than 3 nm. As a result, the waviness in the single crystal SiC layer 6 (seed layer) is also suppressed to a level of less than 3 nm substantially equivalent to the waviness of the interface 8 described above. Also in the lattice image by the cross-sectional TEM, an improvement in the orientation of SiC is seen comparing with the Comparative Example B1.

In the SiC seed layer by the method of Example B1 in which SOI-B and SOI-C are used as the starting materials, similarly, the residual Si layer 5 is left as the lower layer of the single crystal SiC layer 6, thereby, the flatness of the interface 8 with the embedded insulating layer 4 below the residual layer 5 is improved and the waviness in the interface 8 is suppressed to less than 3 nm. Also in the lattice image by the cross-sectional TEM, an improvement in the orientation of SiC is seen comparing with the Comparative Example B1. As a result, the waviness in the single crystal SiC layer 6 (seed layer) is also suppressed to a level of less than 3 nm substantially equivalent to the waviness of the interface 8 described above. Also in the lattice image by the cross-sectional TEM, an improvement in the orientation of SiC is seen comparing with the Comparative Example B1. But, when SOI-C is used as the starting material, airspaces (voids) of a size approximately 100 nm in both depth and lateral directions have occurred directly below the single crystal SiC layer 6 (seed layer). The evaluation results of the Example B1 and Comparative Example B1 are summarized in a table B1 below.

TABLE B1

| Starting Material | SOI-A | SOI-B | SOI-C | SOI-Ref |
|---|---|---|---|---|
| Waviness in Interface of Upper Part of Embedded Oxide Film | O (less than 3 nm) | O (less than 3 nm) | O (less than 3 nm) | X (approx 10 nm) |
| Waviness of Single Crystal SiC Seed Layer Itself | O (less than 3 nm) | O (less than 3 nm) | O (less than 3 nm) | X (approx 10 nm) |
| Occurrence of Void directly below SiC Seed Layer | O (No) | O (No) | X (Yes) | O (No) |

Example B2

The sample after the single crystal SiC layer 6 (seed layer) is formed by the method of Example B1 in which SOI-A is used as the starting material is inserted into a depressurized epitaxial-growth furnace, heated so that the temperature of the wafer reaches 1150° C. while 3 sccm of monomethylsilane is introduced into the epitaxial-growth furnace under depressurizing at approximately $2 \times 10^{-4}$ torr, and then, the wafer is kept for 10 minutes at the same temperature. By this step, the single crystal SiC, epitaxial layer 7 of approximately 100 nm thickness is accumulated on the single crystal SiC layer 6 (seed layer). Then, the power feed to the heater for heating the epitaxial-growth furnace is stopped and the introduction of monomethylsilane is stopped at the same time, the specimen in the electric furnace is cooled in the state until it reaches a predetermined low temperature as a whole, for example approximately 80° C., then the wafer is then taken out from the furnace.

Comparative Example B2

The sample after the single crystal SiC layer 6 (seed layer) is formed by the method of Comparative Example B1 in which SOI-Ref is used as the starting material is inserted into the depressurized epitaxial-growth furnace, and, under the same conditions with the Example B2, the single crystal SiC epitaxial layer 7 of approximately 100 nm thickness is accumulated on the single crystal SiC layer 6 (seed layer).

Evaluation Of Example B2 and Comparative Example B2

Evaluation by an observation of cross-sectional TEM images and evaluation by the X-ray diffraction rocking curve method are performed about SiC epitaxial layers by the methods of Example B2 and Comparative Example B2.

Figure 12:
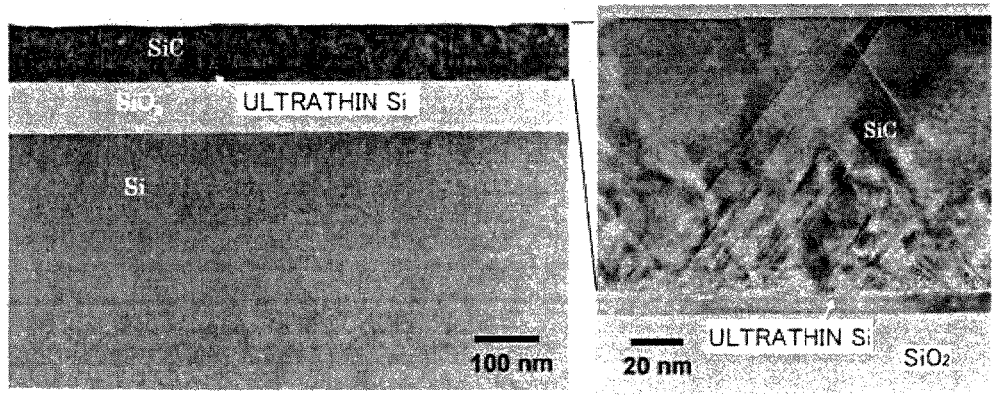
FIG. 12 is cross-sectional TEM images of a single crystal SiC epitaxial layer by the method of Example 2 in which SOI-A is used as the starting material.

The cross-sectional TEM images of the SiC epitaxial layer 7 by the method of Example B2 in which SOI-A is used as the starting material is shown in FIG. 12. The single crystal SiC epitaxial layer 7 of approximately 100 nm thickness is formed above the single crystal SiC layer 6 (seed layer), and the residual Si layer 5 of 3 to 7 nm thickness is left as the lower layer thereof. The good flatness of the interface 8 of the upper part of the embedded insulating layer 4 shown in FIG. 11 is maintained even after the SiC epitaxial step is subsequently executed.

Similarly, even when SOI-B and SOI-C are used as the starting materials, it is confirmed that the good flatness of the interface 8 of the upper part of the embedded insulating layer 4 is maintained even after the SiC epitaxial step is subsequently executed.

Each half width of the peaks of SiC (111) in the single crystal SiC epitaxial layers 7 by the methods of Example B2 and Comparative Example B2 is evaluated by the X-ray diffraction rocking curve method. The evaluation results are summarized in a table B2 below. It is confirmed that the half width of the single crystal SiC epitaxial layer 7 in the Example B2 is the value of approximately 70 to 80% of the half width of the single crystal SiC epitaxial layer 7 formed on the specimen of the Comparative Example B1 under the same conditions with the above, and, by leaving the residual Si layer 5 in the lower part of the single crystal SiC layer 6 (seed layer), the crystal quality of the single crystal SiC epitaxial layer 7 improves.

TABLE B2

| Starting Material | SOI-A | SOI-B | SOI-C | SOI-Ref |
|---|---|---|---|---|
| SiC (111) Peak Half Width by X-ray Diffraction (Standardized with Half Width of SOI-Ref) | 0.7 | 0.7 | 0.8 | 1 |

INDUSTRIAL APPLICABILITY

The invention can be applied to a manufacture and the like of a semiconductor substrate to be used for a large-scale integrated circuit and the like.

What is claimed is:

1. A method for manufacturing a single crystal SiC substrate, comprising:
   preparing an Si substrate having a surface Si layer of a predetermined thickness and an embedded insulating layer; and
   heating the Si substrate in a carbon-series gas atmosphere to convert the surface Si layer into a single crystal SiC layer and causing the Si layer in the vicinity of an interface with the embedded insulating layer to be left as a residual Si layer with a thickness controlled so as to control waviness at the interface of the Si layer and the embedded insulating layer while converting the surface Si layer into a single crystal SiC layer.

2. The method for manufacturing the single crystal SiC substrate according to claim 1, wherein, by epitaxially growing on the single crystal SiC substrate in which the residual Si layer is left in the vicinity of the interface with the embedded insulating layer, single crystal SiC is further grown as an upper layer of the surface single crystal SiC layer.

3. The method for manufacturing the single crystal SiC substrate according to claim 1 or 2, wherein a thickness of the residual Si layer is 3 to 20 nm.

4. A single crystal SiC substrate formed with a single crystal SiC layer that is formed on a surface side of a single crystal Si substrate having an embedded insulating layer with respect to the embedded insulating layer, an Si layer being formed in the vicinity of an interface of the single crystal SiC layer and the embedded insulating layer as a residual Si layer that has a thickness selected to control waviness at the interface of the Si layer and the embedded insulating layer.

5. The single crystal SiC substrate according to claim 4 wherein a thickness of the residual Si layer is 3 to 20 nm.

* * * * *